United States Patent
Celo et al.

(10) Patent No.: US 10,509,165 B2
(45) Date of Patent: Dec. 17, 2019

(54) OPTICAL TRANSPOSER ASSEMBLY

(71) Applicants: Dritan Celo, Nepean (CA); Dominic John Goodwill, Ottawa (CA); Eric Bernier, Kanata (CA)

(72) Inventors: Dritan Celo, Nepean (CA); Dominic John Goodwill, Ottawa (CA); Eric Bernier, Kanata (CA)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 15/957,492

(22) Filed: Apr. 19, 2018

(65) Prior Publication Data
US 2019/0324201 A1    Oct. 24, 2019

(51) Int. Cl.
| | |
|---|---|
| *G02B 6/12* | (2006.01) |
| *G02B 6/30* | (2006.01) |
| *G02B 6/122* | (2006.01) |
| *H01S 5/50* | (2006.01) |

(52) U.S. Cl.
CPC ......... *G02B 6/12004* (2013.01); *G02B 6/122* (2013.01); *G02B 6/30* (2013.01); *H01S 5/50* (2013.01); *G02B 2006/12061* (2013.01); *G02B 2006/12102* (2013.01); *G02B 2006/12104* (2013.01); *G02B 2006/12111* (2013.01); *G02B 2006/12121* (2013.01); *G02B 2006/12123* (2013.01); *G02B 2006/12147* (2013.01)

(58) Field of Classification Search
None
See application file for complete search history.

(56) References Cited

U.S. PATENT DOCUMENTS

| | | | | |
|---|---|---|---|---|
| 6,821,802 B2* | 11/2004 | Ahn | ............... | G02B 6/4201 |
| | | | | 257/E25.032 |
| 8,831,437 B2 | 9/2014 | Dobbelaere | | |
| 9,500,821 B2* | 11/2016 | Hochberg | ............... | G02B 6/423 |
| 9,989,715 B2* | 6/2018 | Hochberg | ............... | G02B 6/423 |
| 9,995,881 B1* | 6/2018 | Patel | ............... | G02B 6/122 |

(Continued)

FOREIGN PATENT DOCUMENTS

| | | |
|---|---|---|
| CN | 106664139 A | 5/2017 |
| CN | 106959488 A | 7/2017 |

OTHER PUBLICATIONS

F.E. Doany et. al., IBM "A Four-Channel silicon Photonic Carrier with Flip-Chip Integrated Semiconductor Optical Amplifier (SOA) Array Providing>10-dB Gain"—2016 IEEE 66th Electronic Components and Technology Conference.

(Continued)

*Primary Examiner* — Tina M Wong

(57) ABSTRACT

An assembly with optical gain assisted optical transposer is provided. The optical transposer which optically couples a fibre array unit and a photonic integrated circuit. The optical transposer includes one or more optical gain elements which are configured to provide optical compensation, for example optical gain to mitigate optical losses associated with multistage photonic integrated devices. According to some embodiments, the optical gain element is a semiconductor optical amplifier (SOA). According to some embodiments the photonic integrated circuit is a SiPh PIC.

18 Claims, 7 Drawing Sheets

(56) References Cited

U.S. PATENT DOCUMENTS

| | | | |
|---|---|---|---|
| 2002/0003232 A1* | 1/2002 | Ahn | G02B 6/4201 |
| | | | 257/81 |
| 2005/0040021 A1 | 2/2005 | Hall | |
| 2014/0153881 A1 | 6/2014 | Liff et al. | |
| 2014/0161385 A1 | 6/2014 | Lessard et al. | |
| 2014/0341506 A1* | 11/2014 | Brenner | G02B 6/428 |
| | | | 385/31 |
| 2016/0013866 A1 | 1/2016 | Doerr | |
| 2017/0045697 A1* | 2/2017 | Hochberg | G02B 6/423 |
| 2018/0052290 A1 | 2/2018 | Kinghorn et al. | |

OTHER PUBLICATIONS

R. Konoikea et al. Lossless Operation of SOA-Integrated Silicon Photonics Switch for 8 × 32-Gbaud 16-QAM WDM Signals; OFC 2018 © OSA 2018.

Russell A. Budd et al. Semiconductor Optical Amplifier (SOA) Packaging for Scalable and Gain-Integrated Silicon Photonic Switching Platforms, 2015 Electronic Components & Technology Conference.

Shorey & Lu on "Progress and Application of Through Glass Via (TGV) Technology", 2016 Corning Incorporated.

\* cited by examiner

OPTICAL TRANSPOSER ASSEMBLY

FIELD

The present invention generally pertains to the field of optical networks, and particular embodiments or aspects relate to optical network equipment and componentry.

BACKGROUND

Silicon optical waveguides have potential as a platform for ultra-small photonic integrated circuits (PICs). In a typical structure, a silicon core with high refractive index is surrounded by a low refractive index material, typically silicon dioxide. This structure forms an optical waveguide, typically used at communications wavelengths such as the 1310 nm or 1550 nm bands, wavelengths for which the silicon and silicon dioxide are transparent. Typical silicon PIC chips use a lithographically-defined layout of single mode and multimode waveguide elements, wherein the whole forms a photonic circuit. Alternate materials systems that may be used can include Si, GaAs, InP, LiNbO3, PLZT, SiN, SiON.

SiPh (silicon photonics) PICs technology is used to build large switch matrices. Switches up to 32×32 have been demonstrated on this technology. A SiPh switch core of this size and with optical packet switch capability can replace an electrical switch used in data centers, for example a circuit switch, packet router and an optical transport network (OTN) switch.

Due to the intrinsic properties of SiPh material system, the optical path has a relatively high optical loss. As a result, multistage photonic integrated devices can demonstrate excessive optical loss. This optical loss can prevent the application of SiPh PIC (photonic integrated circuit) chip to replace electrical switch core in data centers.

Accordingly, there may be a need for an assembly that is not subject to one or more limitations of the prior art.

This background information is intended to provide information that may be of possible relevance to the present invention. No admission is necessarily intended, nor should be construed, that any of the preceding information constitutes prior art against the present invention.

SUMMARY

It is an object of the present invention to obviate or mitigate at least one disadvantage of the prior art.

According to an aspect of the present invention, there is provided an assembly that includes a fibre array unit, an optical transposer and an optical gain element. The fibre array unit is optically coupled to a plurality of optical fibres and the optical transposer includes waveguides optically coupling the fibre array unit and a photonic integrated circuit. The optical gain element is optically coupled to at least one of the waveguides and is configured to provide optical gain to offset optical coupling loss into the at least one waveguide.

According to some embodiments, the optical transposer has a front-end and a back-end and wherein at the front-end the waveguides have a first spacing and the back-end the waveguides have a second spacing, wherein the first spacing is different from the second spacing. According to some embodiments, the first spacing is equal to the second spacing. According to some embodiments, the photonic integrated circuit is a SiPh PIC.

According to some embodiments, the optical transposer is fabricated from glass or silica-on-silicon, or InP or polymer. In some embodiments, the optical transposer is a fibre space concentrator. For example, the optical transposer is configured to convey light between fibres having a first spacing and optical outputs or inputs having a second spacing, e.g. a narrower spacing.

According to some embodiments, the optical gain element is disposed in a well within the optical transposer. In some embodiments, the optical gain element is optically coupled to an edge of the optical transposer.

According to some embodiments, the input optical connection and the output optical connection between the optical gain element and the at least one of the waveguides of the optical transposer, are located on a same side of the optical gain element.

According to some embodiments, an alignment waveguide and alignment loop provide alignment of the optical coupling between the optical gain element and the optical transposer.

According to some embodiments, multiple optical gain elements are optically coupled to the at least one waveguide of the optical transposer.

Embodiments have been described above in conjunctions with aspects of the present invention upon which they can be implemented. Those skilled in the art will appreciate that embodiments may be implemented in conjunction with the aspect with which they are described, but may also be implemented with other embodiments of that aspect. When embodiments are mutually exclusive, or are otherwise incompatible with each other, it will be apparent to those skilled in the art. Some embodiments may be described in relation to one aspect, but may also be applicable to other aspects, as will be apparent to those of skill in the art.

BRIEF DESCRIPTION OF THE FIGURES

Further features and advantages of the present invention will become apparent from the following detailed description, taken in combination with the appended drawings, in which.

DETAILED DESCRIPTION

Figure 1:
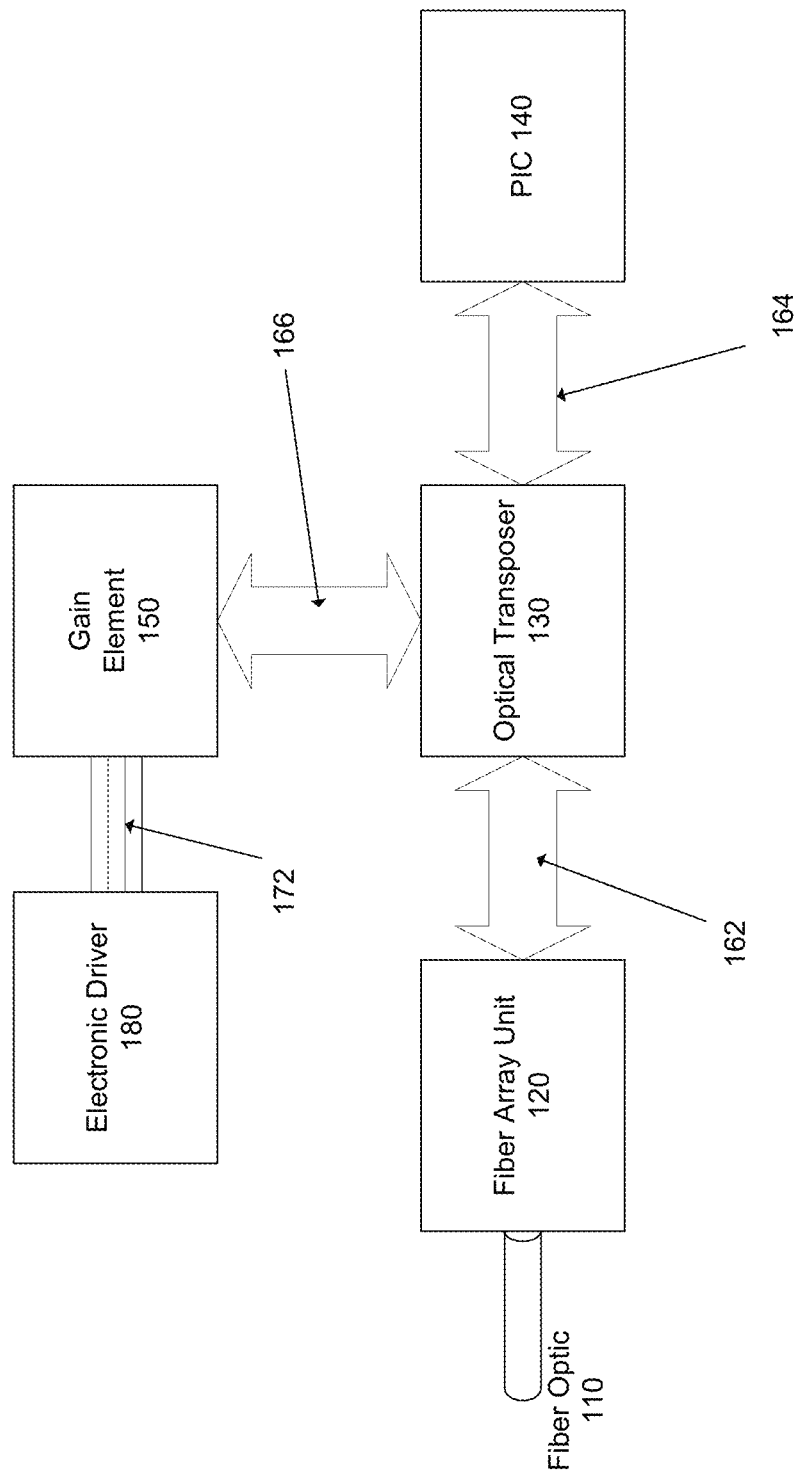
FIG. 1 is a block diagram of an optical transposer with an optically connected optical gain element, wherein the optical transposer optically interconnects a fibre array unit and a photonic integrated circuit, in accordance with embodiments of the present disclosure.

In light of the above noted optical loss associated with multistage photonic integrated devices, there is intensive on-going research to address this issue. Integration of a semiconductor optical amplifier (SOA) into the SiPh PIC has been proposed. SOAs can provide optical gain to offset the insertion-loses and waveguide losses on the SiPh PIC (photonic integrated circuit). However, integration of an optical gain element into a SiPh PIC can be challenging. At this time, there is not a cost-effective method available for monolithic integration of a III-V material device or semiconductor (for example a laser, laser-diode and SOA) on the SiPh PIC. As is known, during fabrication a III-V material typically crystallizes with a highly accurate and uniform stoichiometry and many III-V materials have high carrier mobilities and direct energy gaps, making them useful for optoelectronic devices. As a result of there not being a cost-effective method for monolithic integration of a III-V material device on a SiPh PIC as noted above, at this time a solution can be either the heterogeneous integration, or the hybrid integration of a III-V material device on the SiPh PIC.

Heterogeneous integration refers to the bonding of III-V material with optical gain onto the SiPh PIC (either directly or with an intermediate polymer adhesive layer), followed by the etching of material to create an optical device structure such as a waveguide having optical gain. The amplified light is then evanescently coupled into the on-PIC waveguide. Heterogeneous integration can be regarded as a post-processing step and is often used to create SOAs. The optical gain from these integrated SOAs has a strong (Arrhenius) thermal dependence, and so requires temperature stabilization for stable performance. Such post processing steps are not compatible with the CMOS technology, have low yield and high cost.

Hybrid integration involves direct coupling of light from a discrete III-V device onto the SiPh PIC. Direct coupling can be challenging due to a large mismatch of optical mode field diameter (MFD). Coupling into a Si waveguide with MFD of 3-4 um can be difficult. Further, coupling onto a SiN waveguide layer on or within the SiPh PIC may alleviate the problem, however at this time there is no commercial foundry that offers such a process. Another challenge of the hybrid integration into SiPh PIC is the thermal management. The III-V elements work at elevated temperatures and usually require a thermoelectric cooler (TEC) to aid with maintaining a desired operational temperature range. High operation temperature on the gain element may change the temperature distribution on the PIC, introducing thermal non-uniformities and temperature variation in the PIC elements, thus forcing the PIC to drift out of its operational profile. Beneficially, hybrid integration schemes tend to have the advantage of deploying only 'known good devices', which leads to higher yields and tighter performance profiles, however this can result in lower integration densities than heterogeneous integration schemes.

According to embodiments of the present disclosure, there is provided an optical transposer which optically couples a fibre array unit and a photonic integrated circuit. The optical transposer includes one or more optical gain elements which are configured to provide optical compensation, for example optical gain to mitigate optical losses associated with multistage photonic integrated devices. According to some embodiments, the optical gain element is a semiconductor optical amplifier (SOA). Other forms of an optical gain element can include a laser, laser diode, vertical-cavity surface-emitting laser (VCSEL), another suitable light source or other element that can provide optical gain. According to some embodiments, when the optical gain element is configured as a light source, the light therefrom can be modulated by the photonic integrated circuit.

According to embodiments, by providing an optical gain element on an optical transposer, for example a photonic lightwave circuit, which optically interconnects a fibre array unit and an photonic integrated circuit one or more of the following features can be provided, compensation of optical losses, larger alignment tolerances, reduction of optical coupling loss, improvement of thermal management of the assembly and a reduction of the cost of manufacture of the assembly.

According to some embodiments, the optical transposer is an active fiber space concentrator (FSC) photonic lightwave circuit (PLC) chip including integrated waveguides and one or more integrated optical gain elements. In some embodiments the one or more optical gain elements are embedded within the optical transposer and in other embodiments, the one or more optical gain elements are optically coupled adjacent to the optical transposer.

FIG. 1 is a block diagram of an optical transposer with an optically connected optical gain element, wherein the optical transposer optically interconnects a fibre array unit and a photonic integrated circuit, in accordance with embodiments of the present disclosure. The fibre optics 110, which are optically connected to a light source or plurality of light sources, are optically coupled to a fibre array unit (FAU) 120. The FAU 120 is optically coupled via optical interface 162 to a plurality of waveguides 160 formed within the optical transposer 130. Optically coupled with the optical transposer 130 via optical interface 166, is an optical gain element 150, which is configured to provide optical compensation. For example, optical gain element is configured to provide optical gain to offset optical coupling loss. The waveguides 160 of the optical transposer 130 are optically coupled via optical interface 164 to the photonic integrated circuit (PIC) 140. The optical gain element 150 can be electrically coupled via electrical interface 172 to an electronic driver 180, wherein the electronic driver 180 can provide operational signals to the optical gain element 150 in order to provide a determined amount of optical gain to the optical signal travelling between the fibre array unit 120 and the PIC 164.

In some embodiments, the optical gain element is embedded within the optical transposer, for example inserted within or disposed in a well formed within the optical transposer. In other embodiments, the optical gain element is optically coupled to an edge of the optical transposer. In some embodiments, the optical transposer is configured as a fibre space concentrator (FSC).

According to embodiments, the spacing of the waveguides formed in the optical transposer can be aligned with the spacing of the fibres associated with the FAU. For example, a spacing may be approximately 250 um or 127 um, however it is readily understood that this spacing is merely an example and to be considered nonlimiting. According to embodiments, the mode field diameter (MFD) of the optical fibres of the FAU can be comparable to the MFD of the waveguides at the coupling location of the FAU with the optical transposer, e.g. the optical transposer front-end, and thus can allow for a high efficiency optical coupling. The FAU may include lengths of optical fibre disposed in a 1-dimensional or 2-dimensional uniform or non-uniform array. The FAU may further include mechanical attachment of said fibres to a holder such as a substrate having V-grooves within which the fibres lie, or a plate having locating holes within which the fibres are inserted.

According to embodiments, the waveguides formed in the optical transposer can be continuous waveguides or may be formed in two or more separate sections, depending on the design considerations associated with the optical transposer. According to embodiments, the waveguides at the coupling location of the optical transposer and the PIC, e.g. the optical transposer back-end, can be prearranged such that the spacing of the waveguides at the back-end of the optical transposer substantially match with the spacing of the waveguides associated with the PIC, for example a waveguide spacing associated with a SiPh PIC. It is understood that the spacing of the waveguides at the front-end of the optical transposer can be independent of the spacing of the waveguides at the back-end of the optical transposer and as such the intermediate portions of the waveguides between the front-end and the back-end of the optical transposer are configured to provide the required spacing of the waveguides at the front-end and back-end.

According to embodiments, the optical transposer can be fabricated using inexpensive materials and technologies, thereby mitigating cost of manufacture thereof. In some embodiments, the optical transposer is formed from glass, silica-on-silicon, InP, a polymer or other material technology that allows for the provision of low refractive index contrast waveguides. Accordingly, the waveguides associated with the optical transposer can have a large cross section and mode field diameter. In addition, having an optical gain element integrated with a optical transposer can provide one or more of the following: relaxation of alignment tolerances, allow for low optical coupling loss and potentially avoid a need for optical lenses at in and out facets of the optical transposer.

According to embodiments, an optical transposer, for example a FSC, can be easier to dice and polish and can also allow for flexibility with respect to shapes thereof in order to match packaging requirement for the assembly, for example.

According to some embodiments, the fabrication of the waveguides within the optical transposer can provide for the tilting of the waveguides and supress reflections in and out of the optical gain element associated with the optical transposer.

According to embodiments, the optical transposer is configured as a fibre space concentrator and can combine with a mode field diameter (MFD) converter to create a waveguide array to fibre transposer. As an example, an application of this technology can be provided when coupling the optical transposer to a silicon photonics (SiPh) spot size converter edge coupler with MFD in the range of 3×4 um and pitch which can be as low as 10 um.

According to embodiments, the optical transposer can be adapted for coupling at the front end, e.g. to the FAU, and the back end e.g. to the PIC wherein the coupling can be enabled using edge coupling, vertical coupling, surface grating coupling (SGC), evanescent coupling, butt coupling and similar coupling techniques or other methods which may include lenses, micro-electromechanical systems (MEMS) mirrors and similar methods. These coupling techniques or methods can also be applicable to the optical coupling between the optical gain element and the optical transposer.

According to embodiments, through the coupling to the optical gain element with the optical transposer, the distribution of the optical gain element distribution and the waveguide configurations within the optical transposer become independent from the photonic integrated circuit, for example a SiPh on-chip waveguides. As such, there is an associated flexibility in the layout of the optical gain element and the waveguides associated with the optical transposer, that is not limited by the waveguide configuration on the PIC.

Furthermore, by decoupling or separating the typically high-temperature optical gain elements from the PIC, e.g. SiPh die, there is a realised improvement of thermal management and separation of the SiPh die from the adverse thermal effects thereto that can be caused by the optical gain element.

According to embodiments the PIC can include one or more photonic devices and optical elements, which are configured to manipulate light received from the optical transposer and return the manipulated light into the optical transposer.

Figure 2:
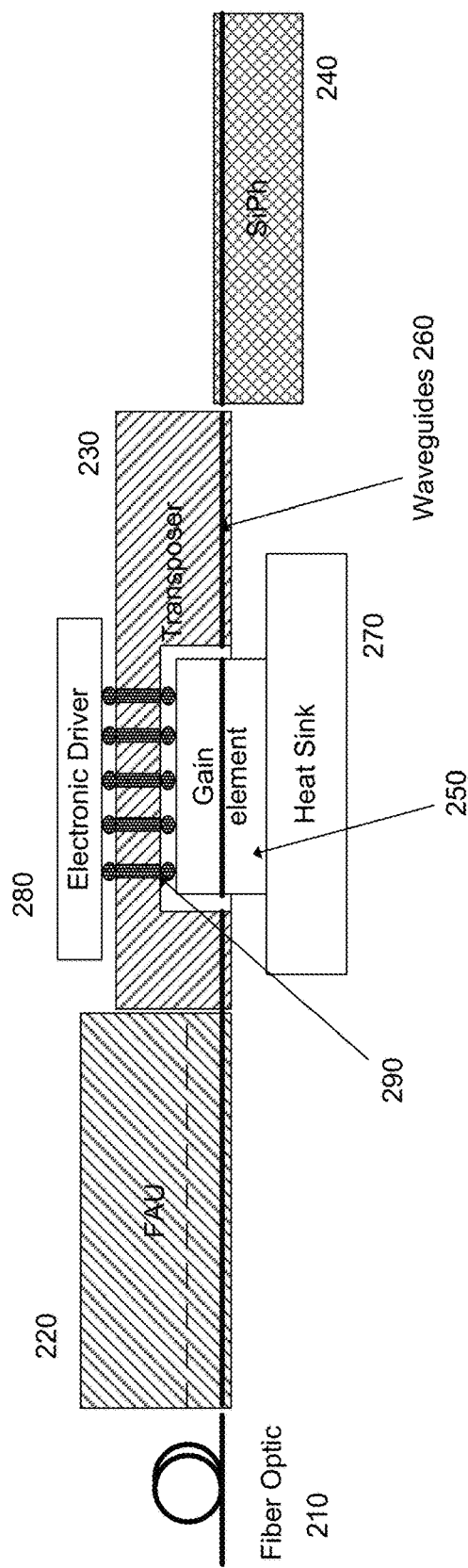
FIG. 2 is a schematic of components of an optical transposer with an optically connected optical gain element, wherein the optical transposer optically interconnects a fibre array unit and a photonic integrated circuit, in accordance with embodiments of the present disclosure.

FIG. 2 is a schematic of an assembly including an optical transposer with an optically connected optical gain element, wherein the optical transposer optically interconnects a fibre array unit and a photonic integrated circuit, in accordance with embodiments of the present invention. The fibre optics 210 are optically coupled to a fibre array unit (FAU) 220. The FAU 220 is optically coupled to a plurality of waveguides 260 formed within the transposer 230. Optically coupled with the transposer 230 is an optical gain element 250, which is configured to provide optical compensation. For example, optical gain element is configured to provide optical gain to offset optical coupling loss. The waveguides 260 of the transposer 230 are optically coupled to the photonic integrated circuit (PIC) 240.

As further illustrated in FIG. 2, the optical gain element 250 can be thermally coupled to a heat sink 270, which can aid in the dissipation of heat generated by the optical gain element 250. In addition, a plurality of vias 290 can provide a means for an electrical interconnection between an electronic driver 280 and the optical gain element 250.

According to embodiments, the coefficient of thermal expansion (CTE) of the optical transposer, which may be manufactured from glass, silica-on-silicon, InP or other material technology, can be adjusted to substantially match the CTE of the photonic integrate circuit, e.g. SiPh or the material of the associated package substrate. The adjustment of the CTE of the optical transposer to that of the photonic integrated circuit can enable the mitigation of the deterioration of optical coupling, signal drifting and thermosmechanical stresses that may occur due to CTE mismatch.

As illustrated in FIG. 2, the electronic driver 280 can be interconnected to the optical gain element thought the provision of vias 290 in the optical transposer material. This interconnection can be enabled by the use of through glass via (TGV) technology, which is a fabrication technique of these vias that is known in the art. As would be readily understood the electrical connection between the optical gain element and the electronic driver can be provided by suitably formed electrical traces between the optical gain element and the optical transposer, which in some instances can pass through the vias associated with the optical transposer.

It will be readily understood that while a heat sink 270 has been illustrated in FIG. 2, other thermal dissipation mechanisms may be also used, for example a thermos-electric cooler, heat pipes or other thermal dissipation or extraction device.

Figure 3:
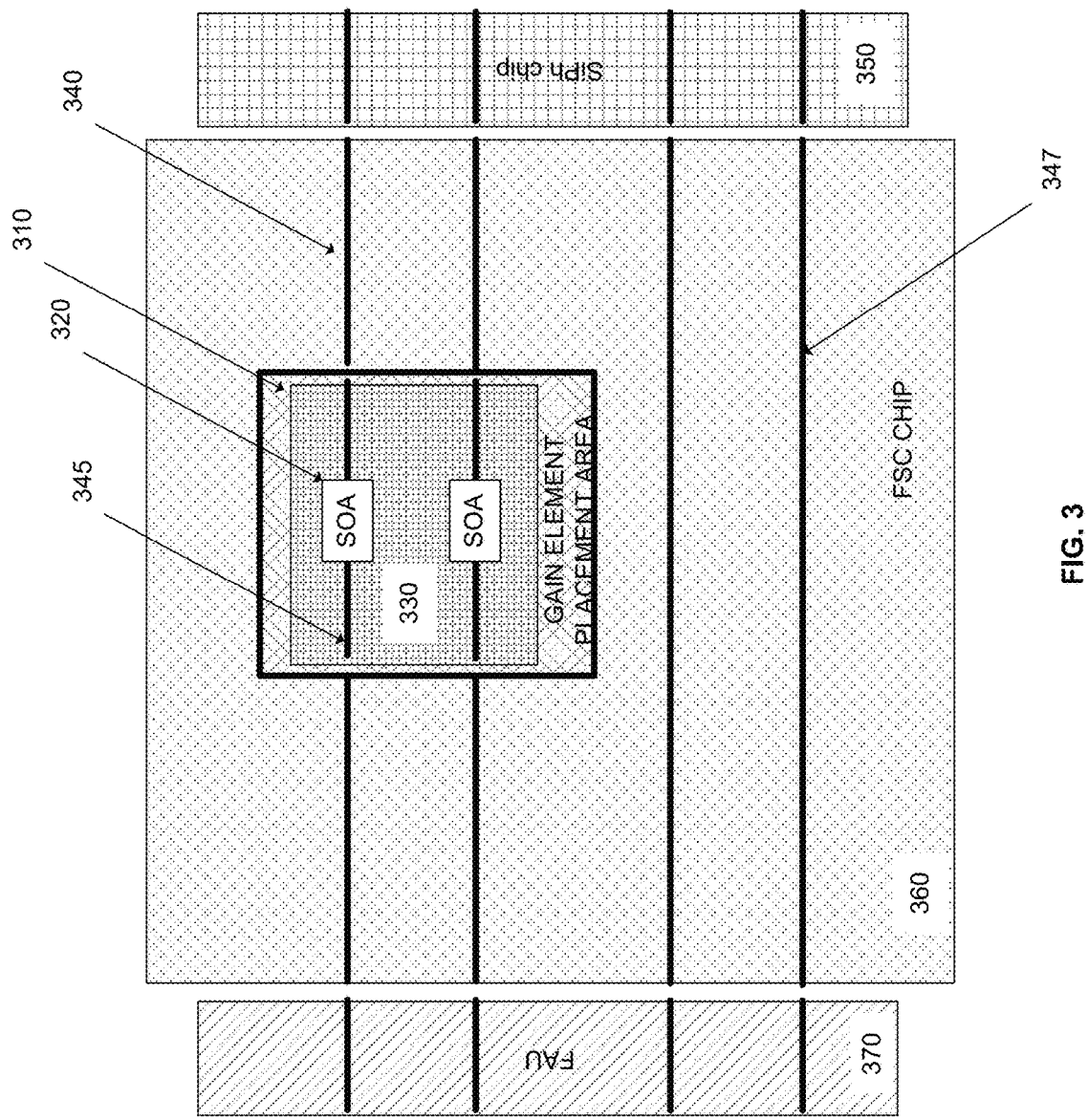
FIG. 3 is a schematic of components of an optical transposer with an embedded optically connected optical gain element, wherein the optical transposer optically interconnects a fibre array unit and a photonic integrated circuit, in accordance with embodiments of the present disclosure.

FIG. 3 is a schematic of assembly including an optical transposer with an embedded optically connected optical gain element, wherein the optical transposer optically interconnects a fibre array unit and a photonic integrated circuit, in accordance with embodiments of the present disclosure. In this example, optical gain is applied to only some of the signals travelling between the FAU 370 and the SiPh PIC 350. As illustrated, the optical transposer is a FSC chip 360 which includes waveguides 347 which directly optically couple the FAU 370 and the SiPh PIC 350. The FSC chip 360 further includes a gain element placement area 310, which in this case is configured as a well within the FSC chip 360 for the placement and positioning of a gain element chip 330. Upon the gain element chip 330 there are positioned two optical gain elements in the form of SOAs 320. The FSC chip includes waveguides 340 which are positioned to optically couple to the waveguides 345 on the gain element chip 330 on each side thereof which in turn couple with the SOAs 320. The waveguides 340 on the FSC chip optically couple the FAU 370 to the optical gain elements and subsequently to the SiPh PIC 350.

Figure 4:
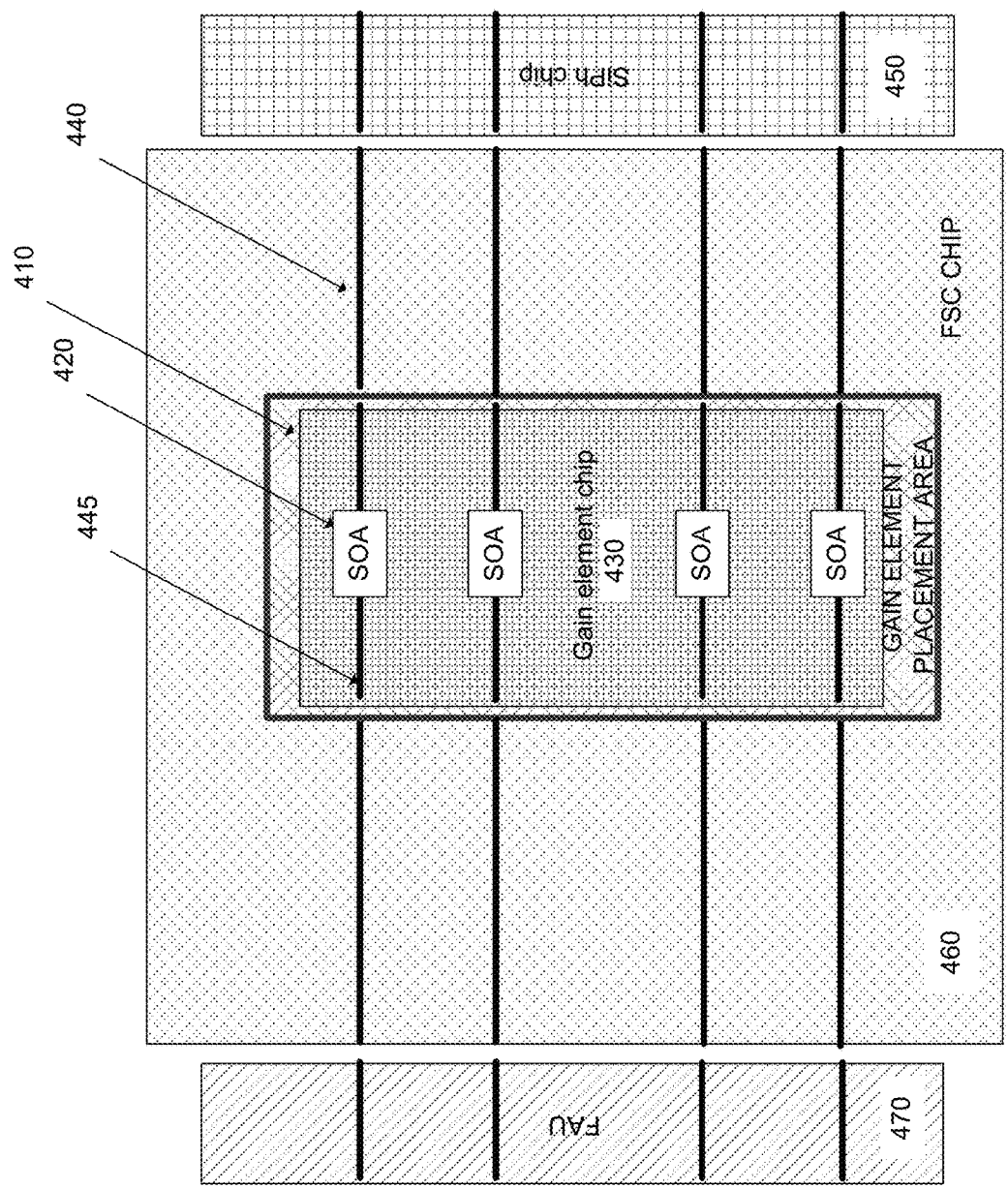
FIG. 4 is a schematic of components of an optical transposer with an embedded optically connected optical gain element, wherein the optical transposer optically interconnects a fibre array unit and a photonic integrated circuit, in accordance with embodiments of the present disclosure.

FIG. 4 is a schematic of an assembly including an optical transposer with an embedded optically connected optical gain element, wherein the optical transposer optically interconnects a fibre array unit and a photonic integrated circuit, in accordance with embodiments of the present disclosure. In this example, optical gain is applied to all of the signals travelling between the FAU 470 and the SiPh PIC 450. As illustrated, the FSC chip 360 includes a gain element placement area 410, which in this case is configured as a well within the FSC chip 460 for the placement and positioning of a gain element chip 430. Upon the gain element chip 430 there are positioned plural optical gain elements in the form of SOAs 420. The FSC chip includes waveguides 440 which are positioned to optically couple to the waveguides on the gain element chip 430 on each side thereof which in turn couple with waveguides 445 coupling with the SOAs 420. The waveguides 440 on the FSC chip optically couple the FAU 470 to the optical gain elements and subsequently to the SiPh PIC 450.

Figure 5:
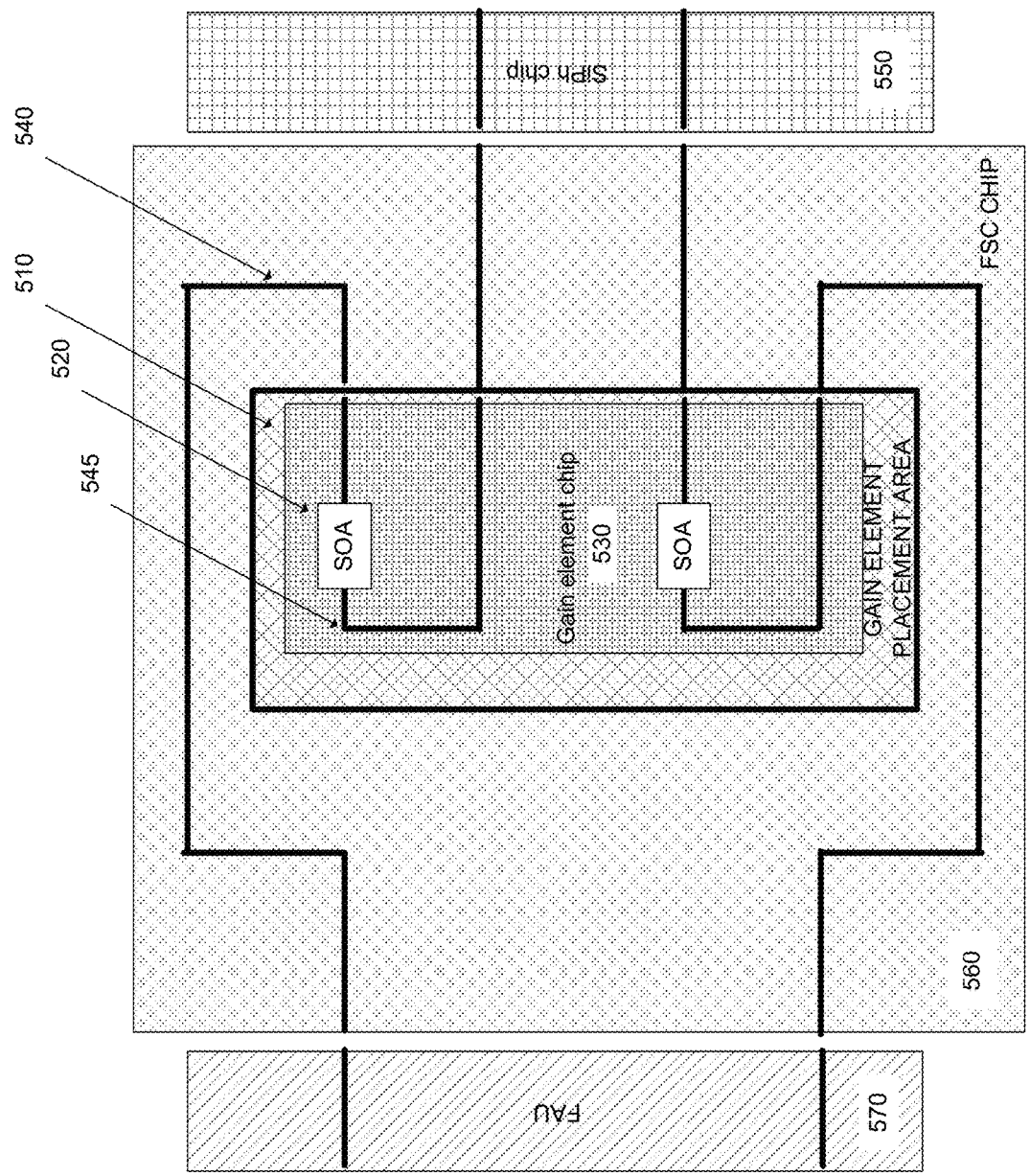
FIG. 5 is a schematic of components of an optical transposer with an embedded optically connected optical gain element, wherein the optical transposer optically interconnects a fibre array unit and a photonic integrated circuit, in accordance with embodiments of the present disclosure.

FIG. 5 is a schematic of an assembly including an optical transposer with an embedded optically connected optical gain element, wherein the optical transposer optically interconnects a fibre array unit and a photonic integrated circuit, in accordance with embodiments of the present disclosure. In this example, optical gain is applied to all of the signals travelling between the FAU 570 and the SiPh PIC 550. As illustrated, the FSC chip 560 includes a gain element placement area 510, which in this case is configured as a well within the FSC chip 560 for the placement and positioning of a gain element chip 530. Upon the gain element chip 530 there are positioned two optical gain elements in the form of SOAs 520. The FSC chip includes waveguides 540 which are positioned to optically couple to the waveguides 545 on the gain element chip 530, such that the waveguides 545 only couple to the gain element chip on one side thereof. These waveguides 545 in turn couple with the SOAs 520. The waveguides 540 on the FSC chip optically couple the FAU 570 to the optical gain elements and subsequently to the SiPh PIC 550. It is important to note that while the waveguides 540 on the FSC chip 560 optically couple to the waveguides on the side of the gain element chip 530, it would be readily understood that this coupling location could equally be on the left side, top or bottom of the gain element chip 530. By the positioning of the input and output connections to the gain element chip on a single side of the chip, a relaxation of the alignment tolerances can be provided. Namely alignment of the waveguides on the FSC chip with the waveguides of the gain element chip on both sides of the gain element chip is overcome by the configuration of the waveguides 545 on the gain element chip 530 and waveguides 540 on the FSC chip 560 as illustrated in FIG. 5.

Figure 6:
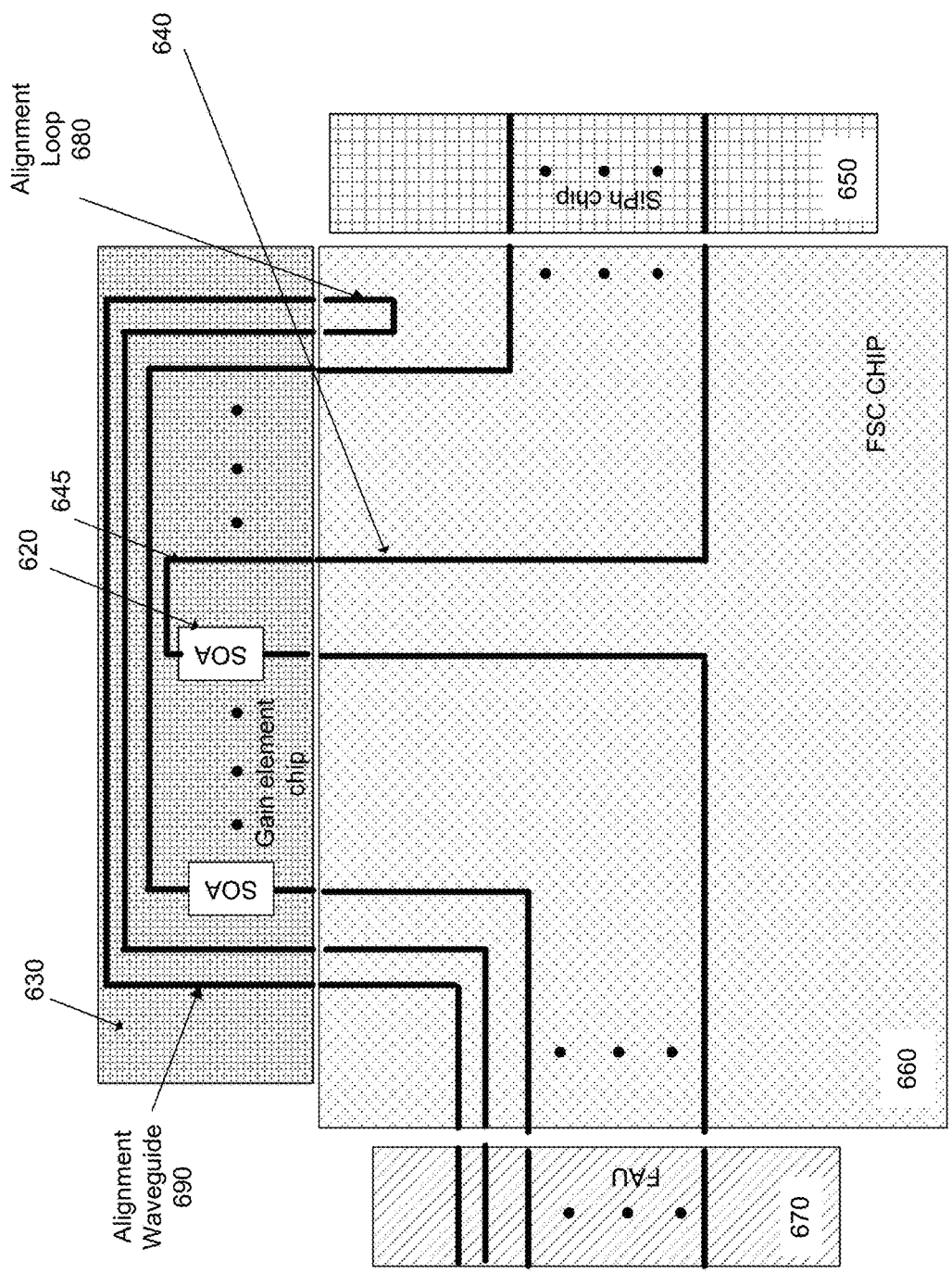
FIG. 6 is a schematic of components of an optical transposer with an adjacent optically connected optical gain element, wherein the optical transposer optically interconnects a fibre array unit and a photonic integrated circuit, in accordance with embodiments of the present disclosure.

FIG. 6 is a schematic of an assembly including an optical transposer with an adjacent optically connected optical gain element, wherein the optical transposer optically interconnects a fibre array unit and a photonic integrated circuit, in accordance with embodiments of the present disclosure. As illustrated, the FSC chip 660 is optically coupled to a gain element chip 630 which is positioned adjacent thereto. The gain element chip 630 includes optical gain elements which are mounted thereon or formed within or disposed in a well in the gain element chip. The optical gain elements in FIG. 6 identify them as SOAs 620, however this is not considered to be a limiting configuration of the optical gain element. Furthermore, while only two optical gain elements are illustrated further optical gain elements may be associated with the optical gain chip. The FSC chip includes waveguides 640 which are positioned to optically couple to the waveguides 645 on the gain element chip 630. These waveguides 645 in turn couple with the SOAs 620. The waveguides 640 on the FSC chip 660 optically couple the FAU 670 to the optical gain elements and subsequently to the SiPh PIC 650. As illustrated, the waveguides 640 on the FSC chip 660 optically couple to a single side of the gain element chip 630. By the positioning of the input and output connections to the gain element chip on a single side of the chip, a relaxation of the alignment tolerances can be provided. According to some embodiments, the optical gain chip 630 includes an alignment waveguide 690 which aligns with an alignment loop waveguide 680 formed in the FSC chip 660. This alignment waveguide 690 and alignment loop waveguide 680 can provide a means for alignment of the gain element chip 630 and the FSC chip 660.

It should be further understood that while the alignment loop waveguide 680 is illustrated such that its optical input and output are directed to the FAU 670, there may alternatively or in addition be an alignment loop waveguide arranged such that its optical input and output are directed to the SiPh PIC 650.

It is further understood, that while the alignment lop waveguide 680 is illustrated only in FIG. 6, a similar alignment loop waveguide may be incorporated within any configuration, including the configurations illustrated in FIGS. 3, 4, 5, 7A and 7B.

Figure 7B:
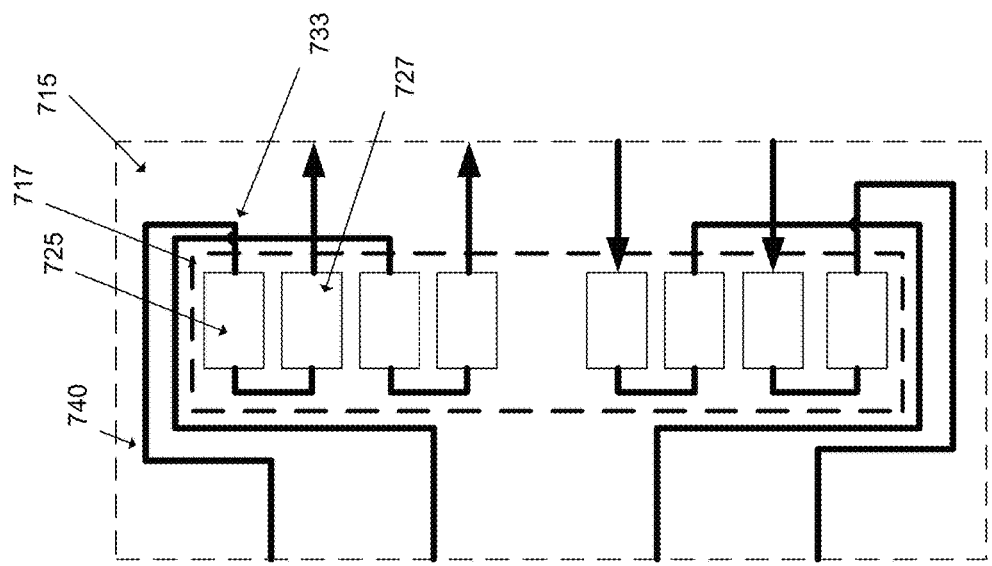
FIG. 7B is a schematic of components of an optical transposer with plural optical gain elements, in accordance with embodiments of the present disclosure.
Figure 7A:
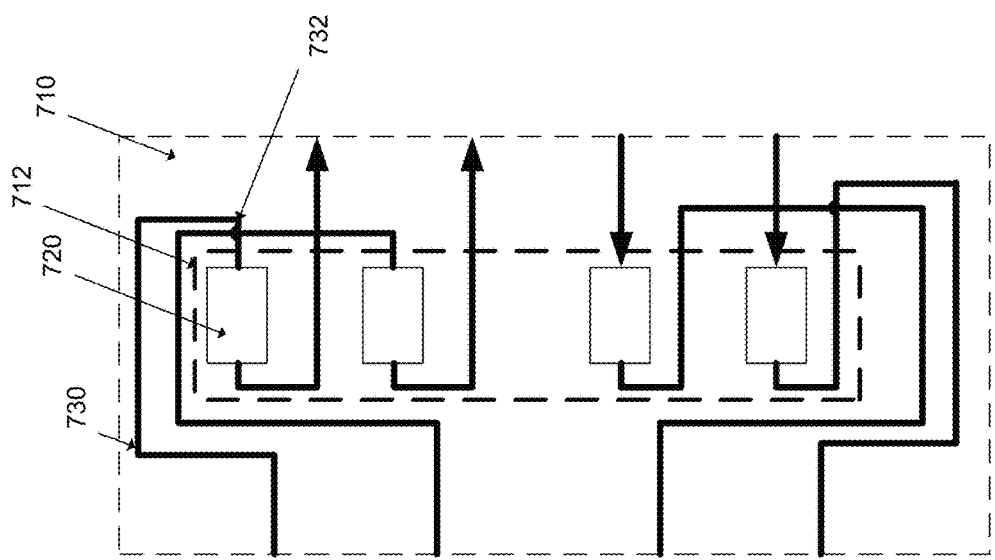
FIG. 7A is a schematic of components of an optical transposer with plural optical gain elements, in accordance with embodiments of the present disclosure.

Having further regard to the configuration optical gain chip having waveguides thereon which enable the optical coupling of the optical gain elements on one side of the optical gain chip, further configurations of the optical gain elements associated with the optical gain chip are illustrated in FIGS. 7A and 7B. In particular, FIGS. 7A and 7B illustrate schematics of components of an optical transposer with plural optical gain elements, in accordance with embodiments of the present disclosure.

In FIG. 7A, the configuration of the optical gain elements is similar to that as illustrated in FIG. 5, however there are four optical gain elements illustrated. Each of the optical gain element 720 provides optical gain to an optical signal travelling within the waveguide 730 of the optical transposer 710. The optical coupling between the optical gain element, in particular the waveguides on the optical gain chip, and the waveguides associated with the optical transposer 710 is illustrated on the right side of the optical gain chip 712, however it would be readily understood that this connection location could equally be on the left side, top or bottom of the optical gain chip 712. The provision of the optical coupling interface of the optical gain chip on a single side thereof can provide a relaxation of alignment tolerances for fabrication. FIG. 7A illustrates an intersection of the waveguides associated with separate optical gain elements, for example at location 732. In some embodiments there may be such intersections of waveguides, for example if the relative ordering of the optical interfaces, for example the optical interface of the FAU, optical transposer, optical gain elements and PIC, require an intersection, or if constraints of layout space require intersections to reduce a layout footprint. In other embodiments the relative ordering of the optical interfaces, for example the optical interfaces of the FAU, optical transposer, optical gain elements and PIC, may be chosen by design such that the number of such intersections is minimized or indeed is zero.

In FIG. 7B, the configuration of the optical gain elements is similar to that as illustrated in FIG. 7A, however the optical gain elements are separated into two sections, wherein optical gain element 725 and optical gain element 727 both provide optical compensation to the optical signal travelling within the waveguide 740 of the optical transposer 715. The provision of the optical compensation of an optical signal to be provided by plural optical gain elements can enable optimization of the optical gain design of the optical gain chip and associated optical transposer thereby enabling the provision of a desired level of optical compensation of optical signals travelling between a FAU and a PIC, e.g. a SiPh PIC. For example, optical gain element(s) are configured to provide optical gain to offset optical coupling loss. For example, this optimization can be at least in part determined based on required thermal compensation associated with the operation of the optical gain elements. By separating these optical gain elements the thermal impact thereof can at least partially be mitigated. For example by separating a single high level heat source (a single optical gain element) into multiple lower level heat sources (multiple optical gain elements), the heat signature of the required optical compensation can be spread over a greater area potentially resulting in a reduction size of the heat dissipation device, e.g. heat sink. The optical coupling between the optical gain element, in particular the waveguides on the optical gain chip, and the waveguides associated with the optical transposer 715 is illustrated on the right side of the optical gain chip 717, however it would be readily understood that this connection location could equally be on the left side, top or bottom of the optical gain chip 717. As previously noted, the provision of the optical coupling interface of the optical gain chip on a single side thereof can provide a relaxation of alignment tolerances for fabrication. Again, it would be readily understood that while FIG. 7B illustrates an intersection of the waveguides associated with separate optical gain elements, for example at location 733, this is merely due to the illustrations view point and the waveguides are separate at location 733.

Although the present disclosure has been described with reference to specific features and embodiments thereof, it is evident that various modifications and combinations can be made thereto without departing from the disclosure. The specification and drawings are, accordingly, to be regarded simply as an illustration of the disclosure as defined by the appended claims, and are contemplated to cover any and all modifications, variations, combinations or equivalents that fall within the scope of the present disclosure.

We claim:
1. An assembly comprising:
a fibre array unit optically coupled to a plurality of optical fibres;
an optical transposer including waveguides, the waveguides optically coupling the fibre array unit and a photonic integrated circuit, the photonic integrated circuit disposed independently of the optical transposer via an optical interface and
an optical gain element disposed in a well within the optical transposer, the optical gain element being optically coupled to at least one of the waveguides, the optical gain element providing optical gain to offset optical coupling loss into the at least one waveguide.

2. The assembly according to claim 1, wherein the optical transposer has a front-end and a back-end and wherein at the front-end the waveguides have a first spacing and the back-end the waveguides have a second spacing, wherein the first spacing is different from the second spacing.

3. The assembly according to claim 1, wherein the optical transposer has a front-end and a back-end and wherein at the front-end the waveguides have a first spacing and the back-end the waveguides have a second spacing, wherein the first spacing equals the second spacing.

4. The assembly according to claim 1, wherein the optical transposer is optically coupled to the fibre array unit or the photonic integrated circuit at least in part using edge coupling, vertical coupling, surface grating coupling, evanescent coupling or butt coupling.

5. The assembly according to claim 1, wherein the optical transposer is optically coupled to the fibre array unit or the photonic integrated circuit at least in part using lenses or micro-electromechanical systems mirrors.

6. The assembly according to claim 1, wherein the optical transposer is fabricated from glass or silica-on-silicon or silicon nitride or InP or polymer.

7. The assembly according to claim 1, wherein the optical transposer is a fibre space concentrator.

8. The assembly according to claim 1, wherein the optical gain element is optically coupled to an edge of the optical transposer.

9. The assembly according to claim 8, wherein an alignment waveguide and alignment loop are provided to alignment of optical coupling between the optical gain element and the optical transposer.

10. The assembly according to claim 1, wherein the optical gain element is thermally coupled to a thermal dissipation device.

11. The assembly according to claim 10, wherein the thermal dissipation device is one or more of a heat sink, thermo-electric cooler and heat pipe.

12. The assembly according to claim 1, wherein the optical gain element is one or more of a semiconductor optical amplifier, a laser, a laser diode and a vertical cavity surface emitting laser.

13. The assembly according to claim 1, wherein an input optical connection and an output optical connection of the optical gain element to the at least one of the waveguides of the optical transposer are located on a same side of the optical gain element.

14. The assembly according to claim 1, wherein multiple optical gain elements are optically coupled to the at least one waveguide of the optical transposer.

15. The assembly according to claim 1, wherein the optical gain element is electrically connected to an electronic drive through vias formed in the optical transposer.

16. The assembly according to claim 1, wherein the photonic integrated circuit is a SiPh photonic integrated circuit.

17. The assembly according to claim 1, wherein optical gain is applied to an optical signal travelling from the fibre array unit to the photonic integrated circuit or vice versa.

18. The assembly according to claim 1, wherein optical gain is only applied to an optical signal travelling from the fibre array unit to the photonic integrated circuit.

* * * * *